(12) United States Patent
Wu et al.

(10) Patent No.: US 9,383,837 B2
(45) Date of Patent: Jul. 5, 2016

(54) TOUCH SCREEN PANEL AND METHOD FOR MANUFACTURING SAME

(71) Applicant: ScienBiziP Consulting (Shen Zhen) Co., Ltd., Shenzhen (CN)

(72) Inventors: Chang-Chin Wu, New Taipei (TW); Ten-Hsing Jaw, New Taipei (TW); Chin-Yang Wu, New Taipei (TW)

(73) Assignee: ScienBiziP Consulting(Shenzhen)Co., Ltd., Shenzhen (CN)

( * ) Notice: Subject to any disclaimer, the term of this patent is extended or adjusted under 35 U.S.C. 154(b) by 52 days.

(21) Appl. No.: 14/482,138

(22) Filed: Sep. 10, 2014

(65) Prior Publication Data

US 2015/0077946 A1 Mar. 19, 2015

(30) Foreign Application Priority Data

Sep. 13, 2013 (TW) ............................... 102133076 A

(51) Int. Cl.
*G06F 3/044* (2006.01)
*G06F 3/0354* (2013.01)
*H05K 1/18* (2006.01)

(52) U.S. Cl.
CPC ............ *G06F 3/03547* (2013.01); *G06F 3/044* (2013.01); *G06F 2203/04103* (2013.01); *H05K 1/189* (2013.01); *H05K 2201/10128* (2013.01); *Y10T 29/49147* (2015.01)

(58) Field of Classification Search
CPC .... G06F 3/044; G06F 3/045; Y10T 29/49147
See application file for complete search history.

(56) References Cited

U.S. PATENT DOCUMENTS

| | | | |
|---|---|---|---|
| 2014/0335350 A1* | 11/2014 | Tanaka | G06F 3/044 428/336 |
| 2014/0377704 A1* | 12/2014 | Mukai | G06F 3/044 430/281.1 |
| 2015/0021081 A1* | 1/2015 | Mitarai | H01L 27/124 174/260 |

* cited by examiner

*Primary Examiner* — Dennis Joseph
(74) *Attorney, Agent, or Firm* — ScienBiziP, P.C.

(57) ABSTRACT

A one glass solution touch screen panel includes a substrate, a shielding layer, an indium tin oxide film layer, a soft circuit board, an infiltrate layer, and a plurality of conducting connectors. The shielding layer is formed on a first portion of the substrate. The indium tin oxide film layer is formed on a second portion of the substrate and has a plurality of indium tin oxide film connecting portions. The soft circuit board is formed on the shielding layer. The infiltrate layer is formed on the connecting portions and defines a plurality of infiltrate gaps within the infiltrate layer. The conducting connectors are formed on the infiltrate layer. The conducting connectors are electrically connected to the soft circuit board. The conducting connectors extend into the infiltrate layer substantially filling a substantial portion of the plurality of infiltrate gaps and electrically connecting to the connecting portions.

6 Claims, 4 Drawing Sheets

TOUCH SCREEN PANEL AND METHOD FOR MANUFACTURING SAME

FIELD

The present disclosure generally relates to a touch screen panel and a method for manufacturing the touch screen panel.

BACKGROUND

Touch screen panels are an input device that, for example, allows instruction to be input by touching different parts of the screen. One glass solution touch screen panel is popular because its thickness and low cost for manufacture.

BRIEF DESCRIPTION OF THE DRAWINGS

Implementations of the present technology will now be described, by way of example only, with reference to the attached figures.

DETAILED DESCRIPTION

Figure 1:
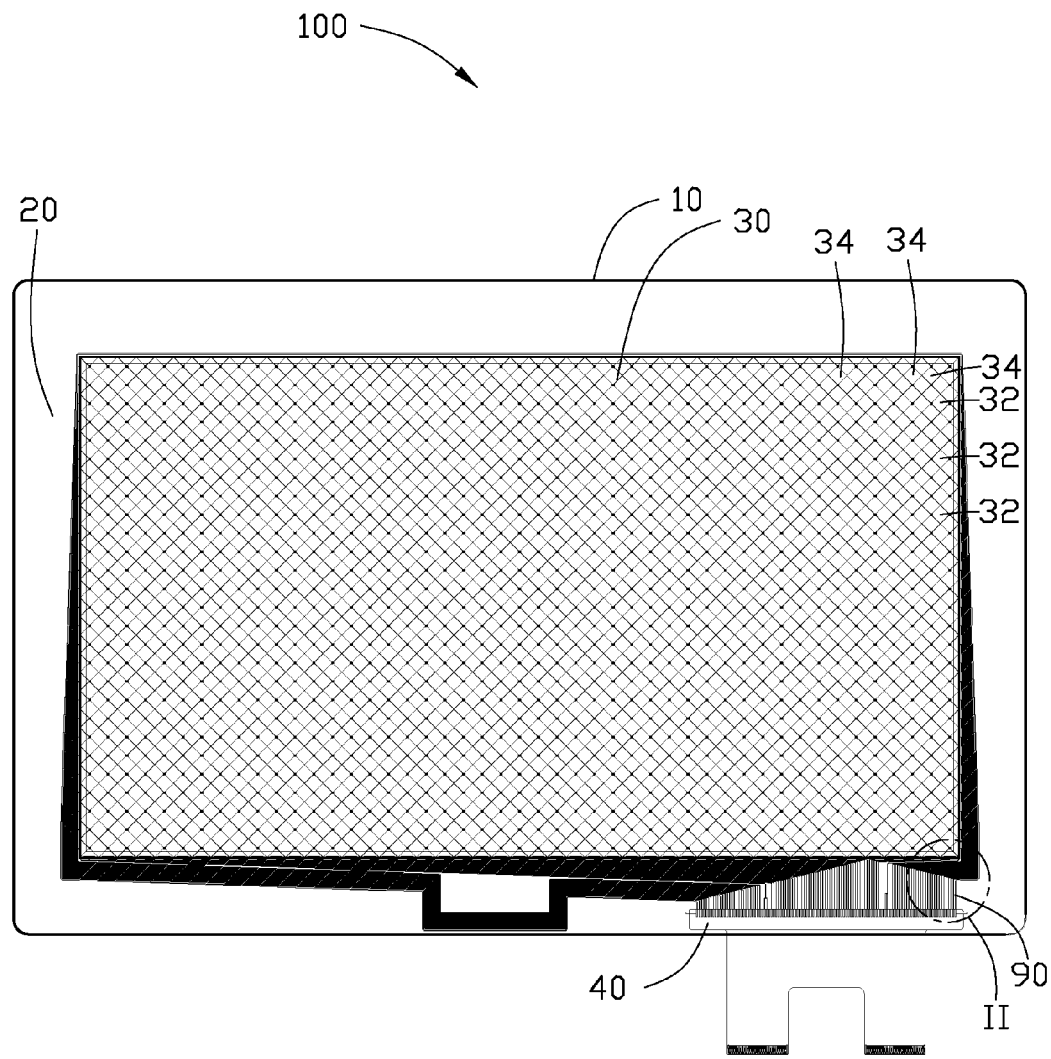
FIG. 1 illustrates a top view of one embodiment of a one glass solution touch screen panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is in relation to a one glass solution touch screen panel. A one glass solution touch screen panel can include a substrate, a shielding layer, an indium tin oxide film layer, a soft circuit board, an infiltrate layer, and a plurality of conducting connectors. The shielding layer can be formed on a first portion of the substrate and have a top shielding layer surface opposite to and substantially parallel to the substrate top surface. The indium tin oxide film layer can be formed on a second portion of the substrate top surface. The indium tin oxide film layer can have a top indium tin oxide film surface opposite to, and substantially parallel to the substrate, and include a plurality of indium tin oxide film connecting portions. The soft circuit board can be formed on a portion of the top shielding layer surface. The infiltrate layer can be formed on a portion of the top indium tin oxide film surface of the plurality of indium tin oxide connecting portions and on a portion of the top shielding layer surface. The infiltrate layer can have a top infiltrate layer surface opposite to, and substantially parallel to, the top indium tin oxide film surface, and define a plurality of infiltrate gaps within the infiltrate layer. The plurality of conducting connectors can be formed on the top infiltrate layer surface. The plurality of the conducting connectors can be electrically connected to the soft circuit board. A portion of the plurality of the conducting connectors can extend into the infiltrate layer substantially filling a substantial portion of the plurality of infiltrate gaps and electrically connecting to the connecting portions of the indium tin oxide layer. The portion of the plurality of the conducting connectors can extend into the infiltrate layer and connecting to the indium tin oxide layer improves adherence of the conducting connectors to the indium tin oxide later.

Figure 3:
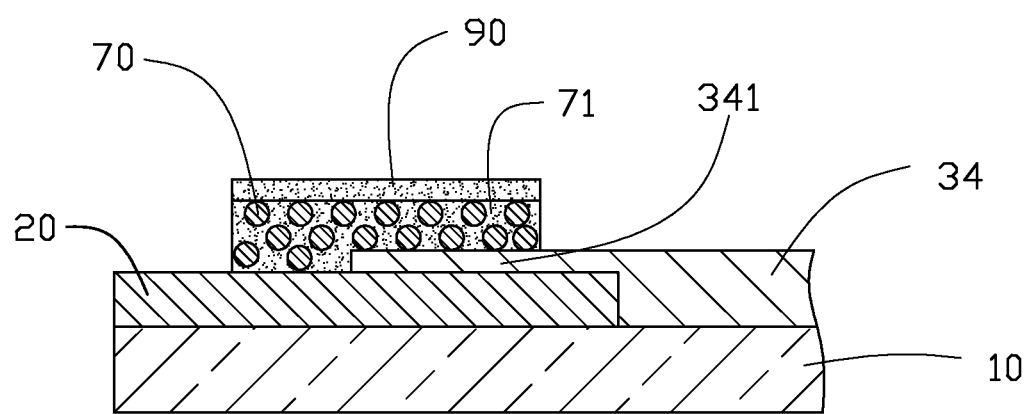
FIG. 3 illustrates a cross section view along line III-III of FIG. 2.

FIG. 1 illustrates a one glass solution touch screen panel 100 of one embodiment including a substrate 10, a shielding layer 20, an indium tin oxide film layer 30, a soft circuit board 40, an infiltrate layer 70 (as shown in FIG. 3), and a plurality of conducting connectors 90. The shielding layer 20 can be formed on a first portion of a top surface of the substrate 10 to form a close frame area on the substrate 10 and substantially parallel to the top surface of the substrate 10. The indium tin oxide film layer 30 can be formed on a second portion of the top surface of the substrate 10 and surrounded by the shielding layer 20. The indium tin oxide film layer 30 can also cover inner edge portions of the shielding layer 20. The soft circuit board 40 can be formed on a top surface of the shielding layer 20 away from the substrate 10. FIG. 3 shows the infiltrate layer 70 can be attached to the shielding layer 20 and the indium tin oxide film layer 30. One end portion of each conducting connector 90 can be positioned on and infiltrate into the infiltrate layer 70 to electrically coupled to the indium tin oxide film layer 30, another end portion of each conducting connector 90 can be coupled to the soft circuit board 40, such that the soft circuit board 40 can be electrically coupled with the indium tin oxide film layer 30. In other embodiments, the indium tin oxide film layer 30 does not cover the inner edge portions of the shielding layer 20, and the shielding layer 20 can cooperate with the indium tin oxide film layer 30 to cover the substrate 10.

Figure 2:
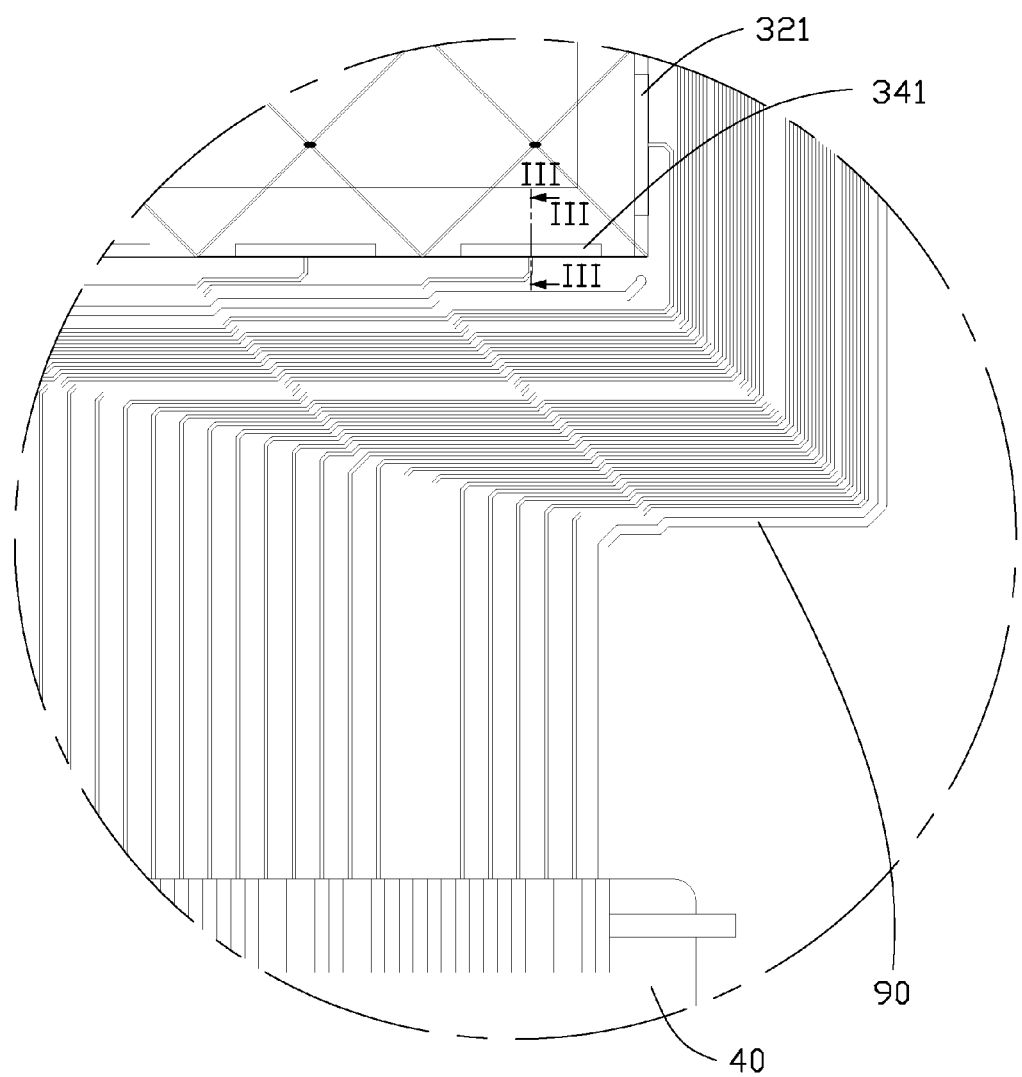
FIG. 2 illustrates an enlarged view of a circled portion II shown in FIG. 1.

The indium tin oxide film layer 30 can have a top indium tin oxide film layer surface opposite to, and substantially parallel to the substrate 10. The indium tin oxide film layer 30 can include a plurality of first electrode arrows 32 and a plurality of second electrode arrays 34. The first electrode arrows 32 and the second electrode arrays 34 can be formed in meshing structures on the substrate 10 and surrounded by the shielding layer 20. The second electrode arrays 34 can be arranged between the first electrode arrows 32, but the second electrode arrays 34 do not overlap the first electrode arrows 32. The first electrode arrows 32 and the second electrode arrays 34 can therefore be insulated from each other. The substrate 10 can be made of a transparent insulation material, such as a transparent glass, polyethylene terephthalate (PET), polyimide (PI), or polycarbonate (PC), for example. FIG. 2 shows each first electrode arrow 32 can include a first connecting portion 321 positioned on an end of the first electrode arrow 32, and each second electrode array 34 can include a second connecting portion 341 positioned on an end of the second electrode array 34.

The infiltrate layer 70 can be formed on the first connecting portions 321, the second connecting portions 341, and portions of the shielding layer 20 adjacent to the first connecting portion 321 and the second connecting portion 341 via an ink jet printing method. The infiltrate layer 70 can include a plurality of infiltrate gaps 71. The plurality of conducting connectors 90 can be formed on a top surface of the infiltrate layer 70. Each conducting connector 90 can infiltrate the infiltrate layer 70 and fill the plurality of infiltrate gaps 71 of the infiltrate layer 70, such that the conducting connector 90 can extend into the first connecting portion 321, the second connecting portion 341, the shielding layer 20, and the soft circuit board 40. The first connecting portion 321 can be electrically coupled to the soft circuit board 40, and the second connecting portion 341 can be electrically coupled to the soft circuit board 40. The infiltrate layer 70 can be made of polymer resin and a plurality of nano inorganic peroxide particles. The polymer resin can be made of one or more material from a group including polyvinyl alcohol polymer, styrene butadiene latex, acrylic resin, polyurethane resin, epoxy resin, silicone resin, and phenolic resin. The plurality of nano inorganic peroxide particles can be made of one or more material from a group including calcium carbonate, titanium dioxide, zinc oxide, aluminium oxide, silicon dioxide. A thickness of the infiltrate layer 70 along a direction substantially vertical to the substrate 10 can be from about 1 micro meter to about 3 micro meters. The infiltrate layer 70 can be banded with the shielding layer 20 and the indium tin oxide film layer 30 well, and nano inorganic peroxide particles can achieve an infiltrating homogeneity of an ink forming the conducting connector 90.

The infiltrate layer 70 can be formed to help the conducting connectors 90 to attach the indium tin oxide film layer 30 and the shielding layer 20.

The infiltrate layer 70 can just be formed on first connecting portion 321 and the second connecting portion 341, and not be formed on the shielding layer 20. In one alternative embodiment, the infiltrate layer 70 can be just formed on the shielding layer 20 and extend to the soft circuit board 40 when the conducting connector 90 can be stably adhered to the indium tin oxide film layer 30, in other words adhesion forces of the conducting connector 90 and the indium tin oxide film layer 30 are well. The conducting connector 90 can be coupled to the first connecting portion 321 and the second connecting portion 341 with one end portion, and another end portion of the conducting connector 90 can be coupled to the soft circuit board 40, a substantial middle portion of the conducting connector 90 can be attached to the shielding layer 20 via infiltrating and filling the infiltrate gaps 71. In another one alternative embodiment, the adhesion forces between the conducting connector 90 and the shielding layer 20 are not well, or the adhesion forces between the conducting connector 90 and the indium tin oxide film layer 30 are not good, the infiltrate layers 70 can be formed on the first connecting portion 321 and the second connecting portion 341, and extend to the soft circuit board 40, and then the conducting connectors 90 can be formed on the infiltrate layers 70 and infiltrate and fill the infiltrate gaps 71 to electrically coupled to the first connecting portion 321 and the second connecting portion 341. The nano inorganic peroxide particles can be omitted.

Figure 4:
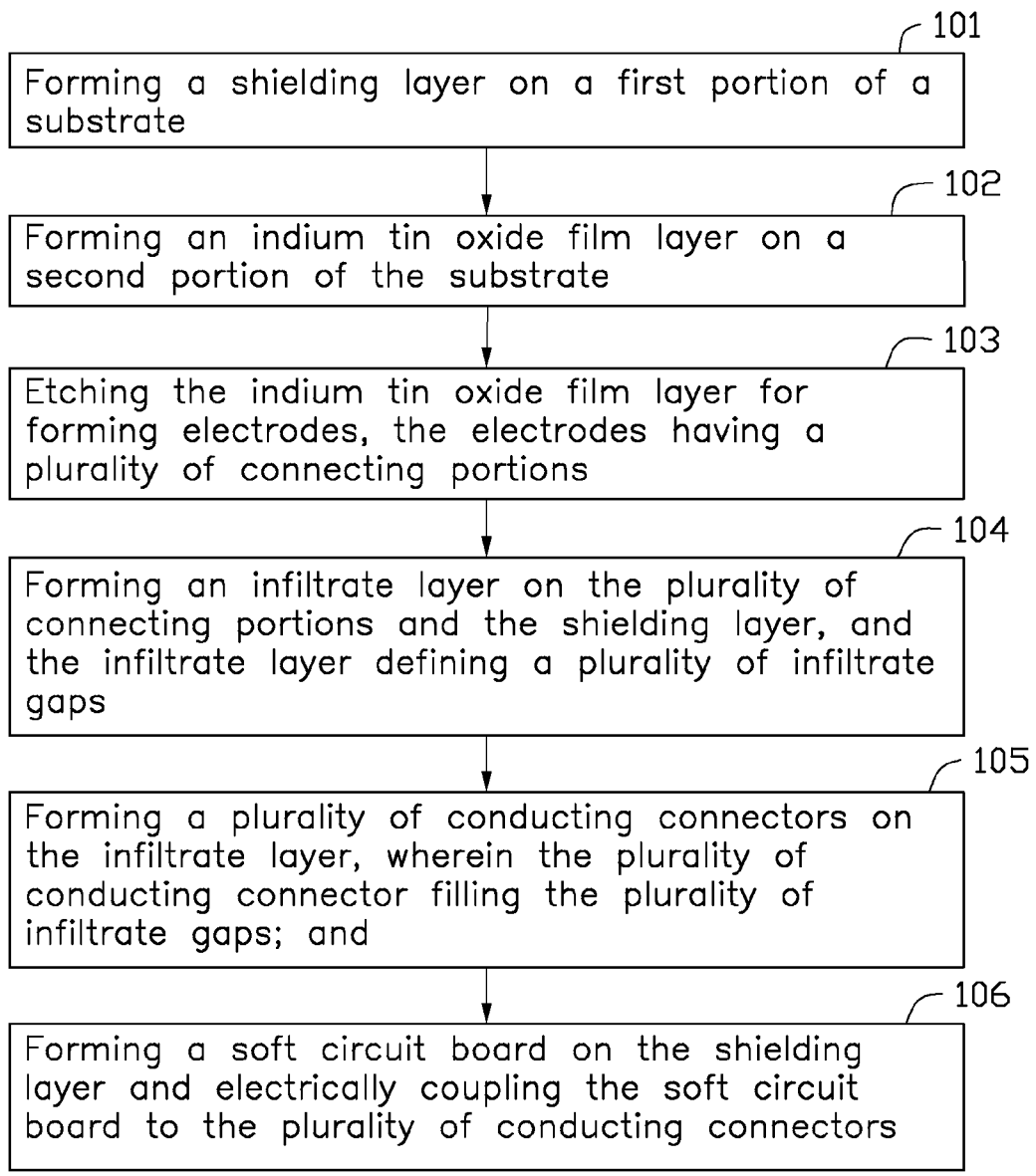
FIG. 4 shows a process for manufacturing the one glass solution touch screen panel of FIG. 1.

FIGS. 4 illustrate the process and method for manufacturing a one glass solution touch screen panel.

In block 101, a shielding layer can be formed on a first portion of a substrate. In the illustrated embodiment, the substrate is a transparent glass, and the first portion is an edge portion of the substrate.

In block 102, an indium tin oxide film layer can be formed on a second portion of the substrate. The indium tin oxide film layer can be surrounded by the shielding layer, and cover inner edge portions of the shielding layer. In the illustrated embodiment, the second portion of the substrate is a substantially middle portion of the substrate, the indium tin oxide film layer is coated on the substrate with a sputtering coating method.

In block 103, the indium tin oxide film layer can be etched and form a plurality of first electrode arrows and a plurality of second electrode arrays arranged between the plurality of first electrode arrows, each first electrode arrow can include a first connecting portion positioned on an end of the first electrode arrow, and each second electrode array can include a second connecting portion positioned on an end of the second electrode array.

In block 104, an infiltrate layer can be formed on the first connecting portions, the second connecting portions, and the shielding layer adjacent to the first connecting portions and the second connecting portions via an ink jet printing method. The infiltrate layer can define a plurality of infiltrate gaps. In at least one embodiment, the infiltrate layer can be formed by a gravure printing method, or a letter pressing printing method, or a flexo printing method, or a silk screen printing method.

In block 105, a plurality conducting connector can be formed on the infiltrate layer via an ink jet printing method, the conducting connector can infiltrate into infiltrate layer and fill the plurality of infiltrate gaps, thereby each first connecting portion can be electrically coupled to one conducting connector, each second connecting portion can be electrically coupled to one conducting connector, and the shielding layer can be coupled to one conducting connector. The conducting connectors can be made of a nano silver ink with an ink jet printing method. In other embodiments, the conducting connectors can be made of other type ink which has conductive nano particles, such as a nano copper ink.

In block 106, a soft circuit board can be positioned on an outer edge of the shielding layer and can be electrically coupled to conducting connectors, such that the soft circuit board can be electrically coupled with the first connecting portions, and the soft circuit board can be electrically coupled with the second connecting portions.

The infiltrate layer can just be formed on first connecting portion and the second connecting portion, and not be formed on the shielding layer. In one alternative embodiment, the infiltrate layer can be just formed on the shielding layer and extend to the soft circuit board when the conducting connector can be stably adhered to the indium tin oxide film layer, in other words adhesion forces of the conducting connector and the indium tin oxide film layer are well. The conducting connector can be coupled to the first connecting portion and the second connecting portion with one end portion, and another end portion of the conducting connector can be coupled to the soft circuit board, a substantial middle portion of the conducting connector can be attached to the shielding layer via infiltrating and filling the infiltrate gaps. In another one alternative embodiment, the adhesion forces between the conducting connector and the shielding layer are not well, or the adhesion forces between the conducting connector and the indium tin oxide film layer are not good, the infiltrate layers can be formed on the first connecting portion and the second connecting portion, and extend to the soft circuit board, and then the conducting connectors can be formed on the infiltrate layers and infiltrate and fill the infiltrate gaps to electrically coupled to the first connecting portion and the second connecting portion. The nano inorganic peroxide particles can be omitted.

The embodiments shown and described above are only examples. Many details are often found in the art such as the other features of a substrate. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A one glass solution touch screen panel comprising:
    a substrate with a top surface;
    a shielding layer formed on a first portion of the substrate, and having a top shielding layer surface opposite to and substantially parallel to the substrate top surface;
    an indium tin oxide film layer formed on a second portion of the substrate top surface, the indium tin oxide film layer having a top indium tin oxide film surface opposite to, and substantially parallel to the substrate, and including a plurality of indium tin oxide film connecting portions;
    a soft circuit board formed on a portion of the top shielding layer surface;
    an infiltrate layer formed on a portion of the top indium tin oxide film surface of the plurality of indium tin oxide connecting portions and on a portion of the top shielding layer surface, the infiltrate layer having a top infiltrate layer surface opposite to, and substantially parallel to, the top indium tin oxide film surface, and defining a plurality of infiltrate gaps within the infiltrate layer; and
    a plurality of conducting connectors formed on the top infiltrate layer surface;
    wherein, the plurality of the conducting connectors is electrically connected to the soft circuit board;
    wherein, a portion of the plurality of the conducting connectors extend into the infiltrate layer substantially filling a substantial portion of the plurality of infiltrate gaps and electrically connecting to the connecting portions of the indium tin oxide layer; and
    wherein, the portion of the plurality of the conducting connectors extending into the infiltrate layer and connecting to the indium tin oxide layer improves adherence of the conducting connectors to the indium tin oxide later.

2. The one glass solution touch screen panel of claim 1, wherein the infiltrate layer is made of one or more material from a group comprising polyvinyl alcohol polymer, styrene butadiene latex, acrylic resin, polyurethane resin, epoxy resin, silicone resin, and phenolic resin.

3. The one glass solution touch screen panel of claim 2, wherein the infiltrate layer further comprises a plurality of nano inorganic peroxide particles.

4. The one glass solution touch screen panel of claim 3, wherein the plurality of nano inorganic peroxide particles are made of one or more material from a group comprising calcium carbonate, titanium dioxide, zinc oxide, aluminium oxide, silicon dioxide.

5. The one glass solution touch screen panel of claim 1, wherein a thickness of the infiltrate layer along a direction substantially vertical to the substrate is from about 1 micro meter to about 3 micro meters.

6. The one glass solution touch screen panel of claim 1, wherein the plurality of infiltrate layers are further formed on the shielding layer adjacent to the plurality of connecting portions, a plurality of connecting connectors are coupled to the shielding layer via filling the plurality of infiltrate gaps adjacent to the plurality of connecting portions.

* * * * *